(12) United States Patent
Chiba et al.

(10) Patent No.: US 7,528,605 B2
(45) Date of Patent: May 5, 2009

(54) SUPERCONDUCTIVE MAGNET DEVICE AND MAGNETIC RESONANCE IMAGING APPARATUS

(75) Inventors: Tomoo Chiba, Ibaraki (JP); Kunihiro Takayama, Ibaraki (JP); Jun Yokoyama, Ibaraki (JP)

(73) Assignees: Hitachi, Ltd., Tokyo (JP); Hitachi Kyowa Engineering Co., Ltd., Hitachi-shi, Tokyo ( * ) Notice: Subject to any disclaimer, the term of this patent is extended or adjusted under 35 U.S.C. 154(b) by 0 days.

(21) Appl. No.: 11/940,668

(22) Filed: Nov. 15, 2007

(65) Prior Publication Data

US 2008/0191697 A1 Aug. 14, 2008

(30) Foreign Application Priority Data

Nov. 17, 2006 (JP) ............................. 2006-311277

(51) Int. Cl.
 *G01V 3/00* (2006.01)
(52) U.S. Cl. .................................................... 324/318
(58) Field of Classification Search ......... 324/300–322; 335/296–306
See application file for complete search history.

(56) References Cited

U.S. PATENT DOCUMENTS

| | | | | | |
|---|---|---|---|---|---|
| 5,113,165 | A | * | 5/1992 | Ackermann | 335/216 |
| 5,304,934 | A | * | 4/1994 | Laskaris et al. | 324/318 |
| 5,317,298 | A | * | 5/1994 | Dorri et al. | 335/301 |
| 5,333,464 | A | * | 8/1994 | Laskaris et al. | 62/51.1 |
| 5,412,363 | A | * | 5/1995 | Breneman et al. | 335/216 |
| 5,439,543 | A | * | 8/1995 | Dorri et al. | 156/184 |
| 6,181,228 | B1 | * | 1/2001 | Laskaris et al. | 335/300 |
| 6,246,308 | B1 | * | 6/2001 | Laskaris et al. | 335/216 |
| 6,437,672 | B1 | * | 8/2002 | Takeshima et al. | 335/216 |
| 6,781,492 | B2 | * | 8/2004 | Takeshima et al. | 335/216 |
| 6,933,722 | B2 | | 8/2005 | Tsuda et al. | |
| 6,967,480 | B2 | * | 11/2005 | Nemoto et al. | 324/318 |

(Continued)

FOREIGN PATENT DOCUMENTS

EP 1 531 337 5/2005

(Continued)

OTHER PUBLICATIONS

Saeki et al., "Compact Superconducting Magnets for Magnetic Resonance Imaging", Hitachi Review, Hitachi, Ltd., Tokyo, Japan, vol. 39, No. 1, Feb. 1, 1990.

*Primary Examiner*—Dixomara Vargas
(74) *Attorney, Agent, or Firm*—Mattingly, Stanger, Malur & Brundidge, P.C.

(57) ABSTRACT

A superconductive magnet device includes: a pair of coil vessels configured to house a plurality of superconductive coils formed circularly, together with a refrigerant; a pair of vacuum vessels configured to house the coil vessels in the vacuum vessels, respectively; a pair of supports configured to connect the vacuum vessels to each other in a state of the vacuum vessels being faced to each other in an up and down direction, wherein a space between the vacuum vessels is made into a uniform magnetic field space; and a refrigerator and a power lead port configured to be provided at an upper portion of one vacuum vessel positioned upper than the other out of the vacuum vessels, wherein the refrigerator is disposed above one support out of the supports, and the power lead port is disposed above the other support different from the one support.

8 Claims, 4 Drawing Sheets

U.S. PATENT DOCUMENTS

| | | |
|---|---|---|
| 6,984,264 B2 | 1/2006 | Shimonosono et al. |
| 7,170,377 B2 * | 1/2007 | Jiang et al. ................. 335/216 |
| 2005/0248350 A1 | 11/2005 | Tsuda et al. |

FOREIGN PATENT DOCUMENTS

| | | |
|---|---|---|
| EP | 1 653 243 | 5/2006 |
| JP | 5-217743 | 8/1993 |
| JP | 11-016718 | 1/1999 |
| JP | 2002-17705 | 1/2002 |
| JP | 2002-209869 | 7/2002 |
| JP | 2004-51475 | 2/2004 |
| JP | 2004-259925 | 9/2004 |
| JP | 2004-349477 | 12/2004 |
| JP | 2005-185551 | 7/2005 |
| JP | 2005-237417 | 9/2005 |

* cited by examiner

SUPERCONDUCTIVE MAGNET DEVICE AND MAGNETIC RESONANCE IMAGING APPARATUS

BACKGROUND OF THE INVENTION

1. Field of the Invention

The present invention relates to a superconductive magnet device and a magnetic resonance imaging apparatus (hereinafter referred to as MRI apparatus), and particularly, to a superconductive magnet device suitable for an open-type MRI apparatus that does not give a siege mentality to a patient body and the MRI apparatus using the same.

2. Description of the Related Art

Conventionally, an MRI apparatus that uses a superconductive magnet device and generates a static magnetic field is widely used especially in a field of a medical diagnosis, and an open-type MRI apparatus that does not give a siege mentality to a patient body is noticed as a biopsy apparatus because of its easy access to the patient body.

The MRI apparatus comprises a pair of cylindrical or elliptical upper and lower vacuum vessels, and has a magnetic space (imaging region) between the vacuum vessels. In each of the vacuum vessels is housed a coil vessel where a plurality of pairs of superconductive main coils different in diameter are housed together with a refrigerant. In the plurality of the pairs of the superconductive main coils are included at least one pair of superconductive mail coils and at least one pair of superconductive shielding coils so that a uniform static field is generated in a spherical or ellipse-spherical imaging region having a center within a gantry gap.

As the refrigerant housed in the coil vessels, liquid helium is used, and in order to reduce the consumption of the liquid helium, an ultra low temperature refrigerator for again condensing a vapor gas is used.

Generally, a refrigerator is installed at the upper center position of an upper vacuum vessel or above the position of a side support member for joining a pair of the upper and lower vacuum vessels from the need of condensing a vapor gas again (for example, see Japanese Patent Laid-Open Publication Nos. 2002-17705, 2005-237417, and 2005-185551).

Furthermore, as a service port having such a power lead for supplying an excitation current to superconductive main coils, a service port (Japanese Patent Laid-Open Publication No. H05-217743) that is attachable and detachable, and another service port (Japanese Patent Laid-Open Publication No. 2004-51475) having a supply port for supplying helium are disclosed.

By the way, in the conventional technology recited in the above JP 2004-51475, a refrigerator, a power lead, and a supply port are configured to be disposed adjacently, and if such the configuration is adopted in apparatuses shown in the JP 2002-17705, the JP 2005-237417, and the JP 2005-185551, it is not possible to simultaneously perform a maintenance work relating to the refrigerator, the attachment and detachment work of the power lead, and the supply work of liquid helium through the supply port. For example, the power lead is obstructive in the maintenance work relating to the refrigerator, and the refrigerator is obstructive in the attachment and detachment work of the power lead.

Furthermore, if a power lead port to which the power lead is connected and the refrigerator are disposed adjacently, there is a possibility that a combined whole shape thereof is jumboized and that the shape becomes complicated such that a port of the refrigerator cannot be configured to be cylindrical so as to match a contour of the refrigerator.

Furthermore, in such a power lead port as shown in the JP H05-217743 where the attachable and detachable power lead is used, because gas cooling is necessary while electricity is passed through the power lead port, dew condensation may occur in the power lead port due to the cooling effect of the cooling gas. In this case, if the refrigerator and the power lead port are disposed adjacently, there is a possibility that vacuum heat insulation of the superconductive magnet device is reduced because such defects are caused that a vacuum packing used for vacuum sealing of the refrigerator deteriorates, and that a moisture generated from dew condensation permeates the vacuum packing and a vacuum leak of the refrigerator occurs. If the vacuum heat insulation is reduced, there is also a possibility that it causes the decrease of the refrigerant and finally comes into coil quench of the superconductive magnet.

Consequently, there is a need for a superconductive magnet device and an MRI apparatus, wherein the maintenance work of a refrigerator and the attachment and detachment work of a power lead port may be performed simultaneously without a trouble.

SUMMARY OF THE INVENTION

According to the present invention, because it is configured that a refrigerator and a power lead port are separately disposed above a pair of supports by which a pair of vacuum vessels are connected to each other in a state of being faced to each other in an up and down direction, the refrigerator is not obstructive in a maintenance work relating to the refrigerator, and the power lead port is not obstructive in an attachment and detachment work of the power lead port. Accordingly, the maintenance work of the refrigerator and the attachment and detachment work of the power lead port may be performed simultaneously without a trouble. Furthermore, because the power lead port and the refrigerator are not adjacent, a crack of a vacuum packing of the refrigerator due to gas cooling of the power lead port and a vacuum leak of the refrigerator do not occur, and the performance of the superconductive magnet device may be stably maintained for a long period.

Furthermore, in accordance with the MRI apparatus where the superconductive magnet device is used, because the maintenance work of the refrigerator and the attachment and detachment work of the power lead port may be performed simultaneously without a trouble, the time saving of the maintenance work may be achieved, and its economical effect is large, and the cost of the maintenance work may be reduced by the time saving.

According to the present invention, the superconductive magnet device and the MRI apparatus may be obtained, wherein the maintenance work of the refrigerator and the attachment and detachment work of the power lead port may be performed simultaneously without a trouble.

BEST MODE FOR CARRYING OUT THE INVENTION

Figure 1:
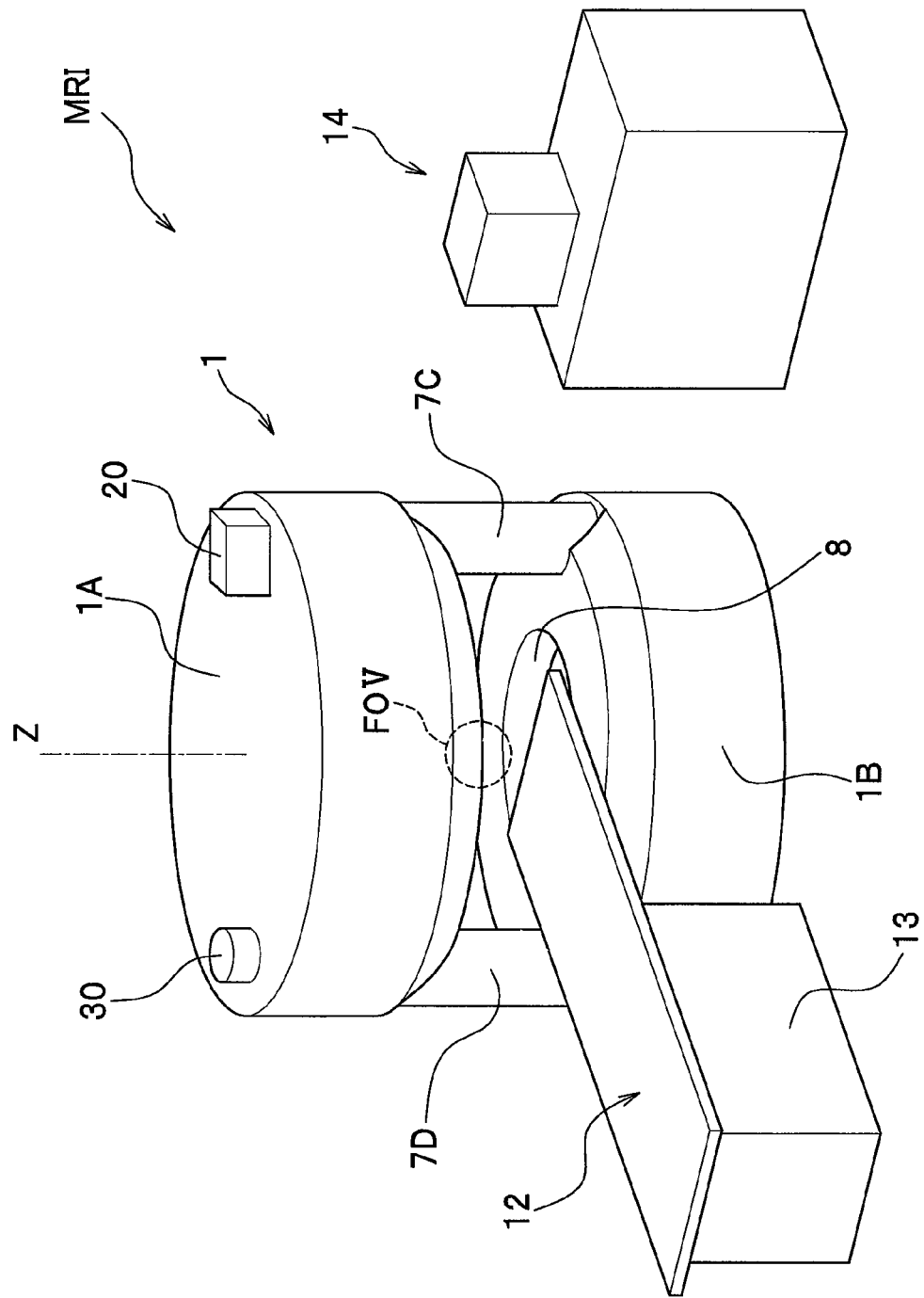
FIG. 1 is an illustration drawing showing a magnetic resonance imaging apparatus comprising a superconductive magnet device of the present invention.

Here will be in detail described an embodiment of an MRI apparatus where a superconductive magnet device of the present invention is used, with reference to drawings. As shown in FIG. 1, the MRI apparatus comprises a superconductive magnet device 1; a bed 12 (not shown, same hereafter) where a patient body is placed; a carrier device 13, where a drive mechanism not shown is provided, and configured to carry the patient body placed on the bed 12 to an imaging region FOV (Field Of View); and an analyzer 14 comprising an instrument such as a computer configured to analyze a nuclear magnetic resonance signal from the patient body carried to the imaging region FOV by the carrier device 13, wherein a tomogram is taken through the patient body placed on the bed 12. Here, an axis to which a reference Z is appended in FIG. 1 is a center axis passing the center of the superconductive magnet device 1 and a perpendicular axis passing the center portion of the imaging region FOV.

Figure 2:
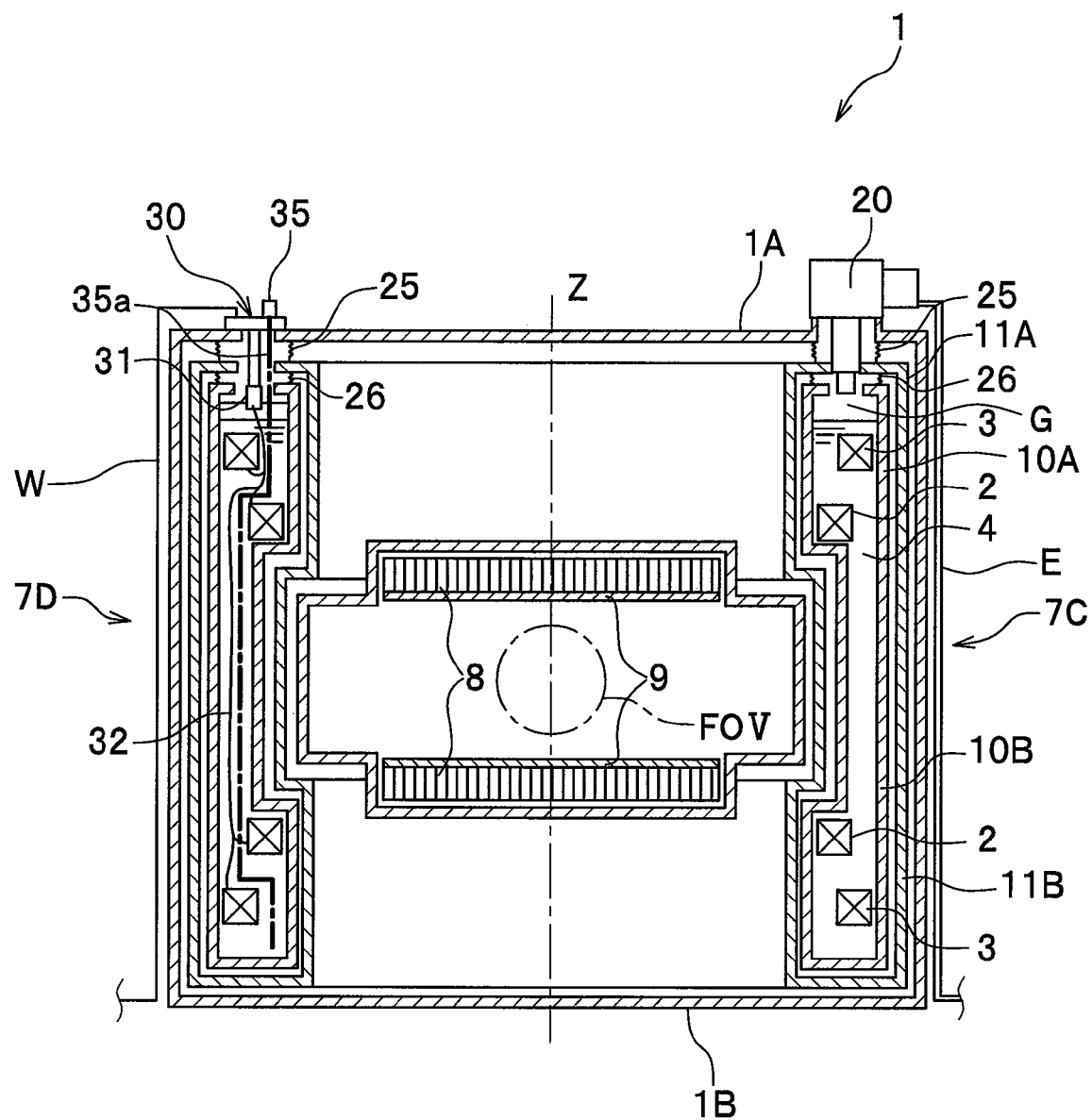
FIG. 2 is a schematic section drawing showing a structure of the superconductive magnet device.

As shown in FIG. 2, the superconductive magnet device 1 is configured so that each one of superconductive main coils 2 and superconductive shielding coils 3 circularly formed, respectively, is housed in each of upper and lower coil vessels 10A, 10B together with a superconductivity-use refrigerant 4; and so that the coil vessels 10A, 10B are housed in the vacuum vessels 1A, 1B, respectively, of which insides are kept to be vacuum through upper and lower heat insulation 11A, 11B, respectively. Then a space between the vacuum vessels 1A, 1B is made into a state of a uniform magnetic field, and the superconductive magnet device 1 comprises: a pair of supports 7C, 7D configured to connect each of the vacuum vessels 1A, 1B in a state of the vessels 1A, 1B being faced to each other in an up and down direction; and a refrigerator 20 and a power lead port 30 provided on an upper portion of the upper vacuum vessel 1A.

According to the embodiment, in the pair of the supports 7C, 7D, the refrigerator 20 is disposed above the support 7C, and the power lead port 30 is disposed above the support 7D. The supports 7C, 7D are disposed respectively on both sides (disposed on a side and its opposite side by 180 degrees) of the superconductive magnet device 1 in a radial direction, interposing the center axis Z therebetween; thereby, the refrigerator 20 and the power lead port 30 are configured to be disposed separately on the both sides in the radial direction, interposing the center axis Z.

In the superconductive main coils 2 and the superconductive shielding coils 3, as a coil wire rod, for example, a NbTi wire rod is used and the coils 2, 3 are supported within the coil vessels 10A, 10B by supports not shown, respectively.

In the embodiment a current of a predetermined direction is adapted to flow in the superconductive main coils 2, and a current of the reverse direction is adapted to flow in the superconductive shielding coils 3. In addition, correction coils and the like not shown are provided within the vacuum vessels 1A, 1B, respectively. Furthermore, as the superconductivity-use refrigerant 4, for example, liquid helium is used.

It is configured that the vacuum vessel 1A, 1B are communicated with each other within the supports 7C, 7D, and the coil vessels 10A, 10B housed in the vessel 1A, 1B are communicated with each other, too; and that the heat shields 11A, 11B housed in the vessel 1A, 1B are connected to each other within the supports 7C, 7D. Thus the liquid helium 4 is adapted to flow between the vacuum vessels 1A, 1B. In addition, in the upper vacuum vessel 1A and the lower vacuum vessel 1B, depressions are formed, respectively, so as to be faced to the imaging region FOV; inclined magnetic field coils 8 are provided in the depressions, respectively. In the inclined magnetic field coils 8 are provided RF (Radio Frequency) coils 9, respectively.

The coil vessels 10A, 10B are covered by the heat shields 11A, 11B in their whole circumference, respectively, and the heat insulation from outsides of the vessels 10A, 10B is achieved. Furthermore, the heat shields 11A, 11B are covered by the vacuum vessels 1A, 1B, respectively, and thereby a space between the coil vessels 10A, 10B and outsides thereof is made vacuum and the heat insulation from outsides of the vacuum vessels 1A, 1B is achieved.

Figure 3:
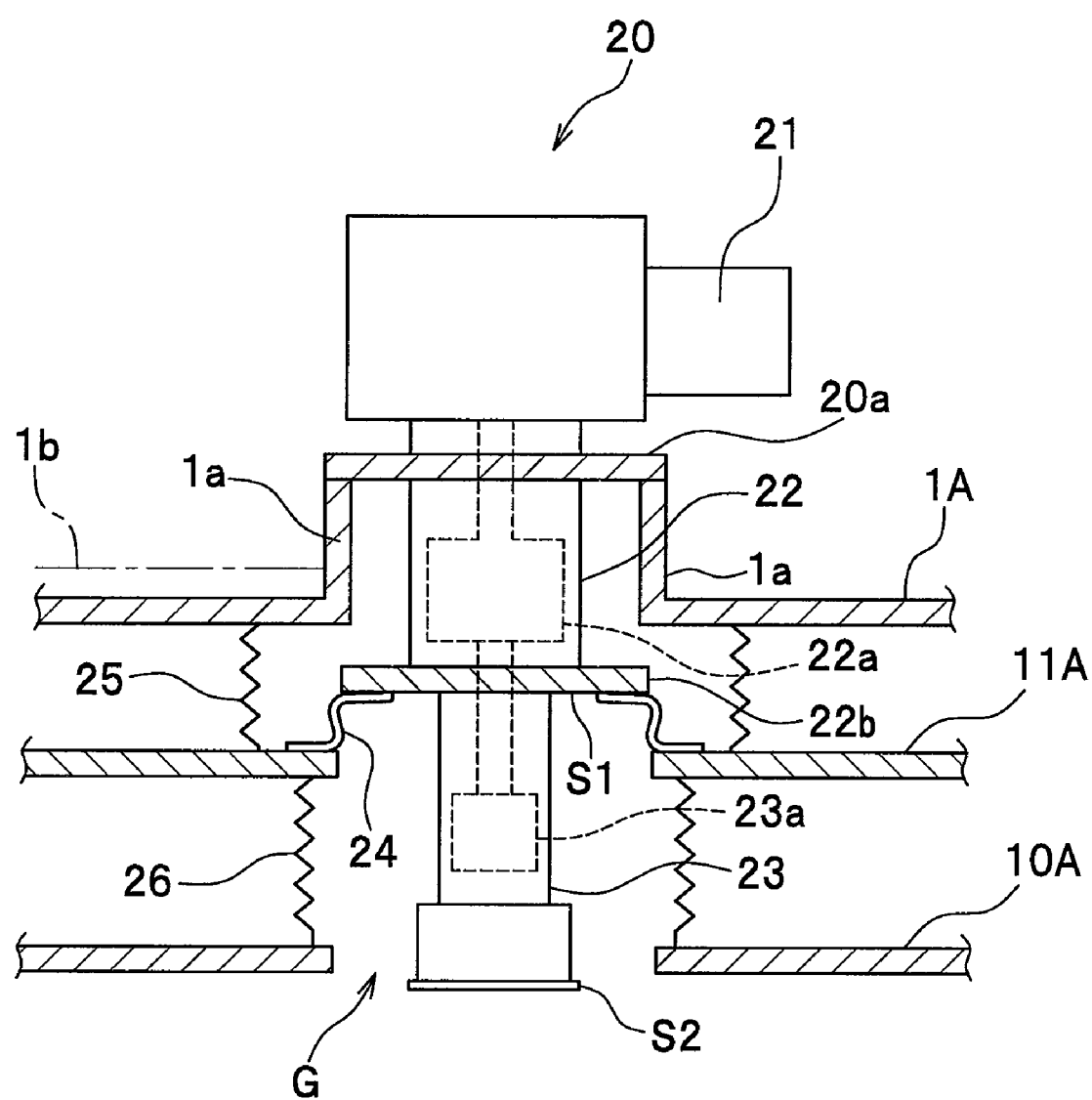
FIG. 3 is a schematic section drawing showing a refrigerator used in for the superconductive magnet device.

The refrigerator 20 is a Gifford-MacMahon refrigerator, and as described above, is disposed above the support 7C and fixed to the upper vacuum vessel 1A. According to the embodiment, as shown in FIG. 2, it is configured that the refrigerator 20 is disposed between the superconductive main coil 2 and the superconductive shielding coil 3 in the radial direction of the vacuum vessel 1A (coil vessel 10A). The refrigerator 20 comprises, as shown in FIG. 3, a drive motor 21, a first cylinder 22, and a second cylinder 23.

In the first cylinder 22 is housed a first cool storage 22a; in the second cylinder 23 is housed a second cool storage 23a. A first expansion chamber not shown is provided between the first cool storage 22a and the second cool storage 23a, and a first cooling stage S1 is provided at bottom of the first expansion chamber. Furthermore, a second expansion chamber not shown is provided between the second cool storage 23a and a top wall of the second cylinder 23, and a second cooling stage S2 made into a state of a lower temperature than the first cooling stage S1 is provided at bottom of the second expansion chamber.

The refrigerator 20 thus described cools the upper heat shield 11A through the first cooling stage S1 and liquefies gaseous helium (vapor gas G) through the second cooling stage S2.

In addition, according to the embodiment, although the upper heat shield 11A having one layer are shown, it is not limited thereto; the shield 11A, may also be configured with any one of two and three layers. In this case, also the refrigerator 20 is provided with cooling stages depending on the number of layers, each heat shield is adapted to be preferably cooled.

In a top plate of the upper vacuum vessel 1A, which is an attached position of the refrigerator 20, is provided a cylindrical port 1a integrally and protrudingly formed upward from the top plate; and a fixation flange portion 20a of the refrigerator 20 is adapted to be fixed to the port 1a by using a bolt and the like not shown in the port 1a. The refrigerator 20 is configured, in a state of being fixed to the port 1a, so that a flange portion 22b provided at a lower end of the first cylinder 22 is positioned upper than the upper heat shield 11A, wherein a space between the portion 22b and the shield 11A is thermally connected by a heat transferable flexible member 24. By providing the heat transferable flexible member 24 thus described, a vibration of the refrigerator 20 may be preferably prevented from being transmitted to the upper heat shields 11A and the upper coil vessel 10A.

Furthermore, in a state of the refrigerator 20 being fixed to the port 1a through a vacuum packing not shown, the second cooling stage S2 comes into a state of being positioned in a space communicated with the upper coil vessel 10A.

A bellows 25 is provided between the top plate of the upper vacuum vessel 1A and the upper heat shield 11A around the refrigerator 20 so as to surround the first cylinder 22. Moreover, a bellows 26 is provided between the upper heat shield 11A and the upper coil vessel 10A so as to surround the second cylinder 23 of the refrigerator 20. Because the bellows 25, 26 thus described are provided and the second cylinder 23 of the refrigerator 20 is disposed in a space (space where the vapor gas G exists) fronting the upper coil vessel 10A, the vibration of the refrigerator 20 may be more preferably prevented from being transmitted to the upper heat shield 11A and the upper coil vessel 10A.

Furthermore, the upper portion of the refrigerator 20 is covered by a magnetic shield not shown.

Here, the refrigerator 20 is adapted to be heavier than the top plate of the upper vacuum vessel 1A in weight. Therefore, when the refrigerator 20 is disposed at the center portion of the upper vacuum vessel 1A as conventionally disposed, there is a possibility that the vibration of the refrigerator 20 during its operation is transmitted from the upper vacuum vessel 1A to the lower vacuum vessel 1B through the supports 7C, 7D and extends to whole of the superconductive magnet device 1.

Figure 4:
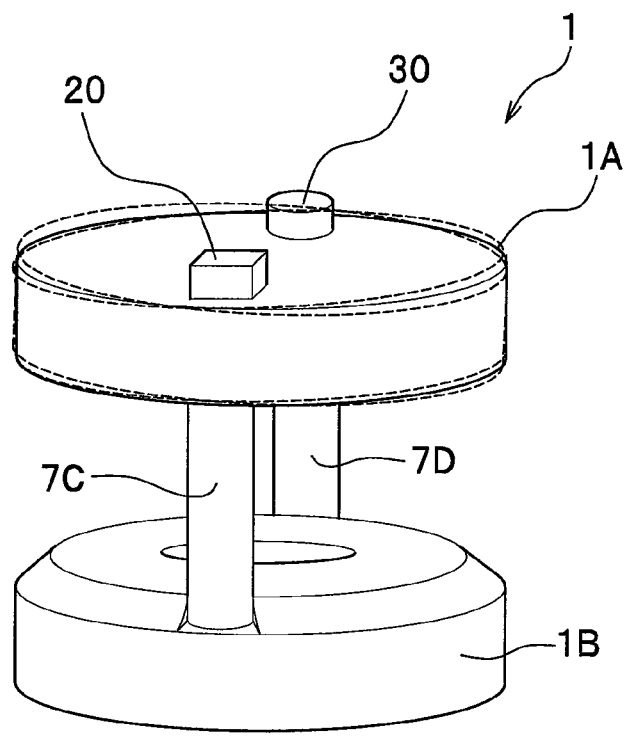
FIG. 4 is a schematic section drawing showing a manner of a vibration of the superconductive magnet device.

On the contrary, according to the embodiment, because the refrigerator 20 is disposed above the support 7C, as shown in FIG. 4, a portion where the refrigerator 20 is disposed, that is, a portion above the support 7C, becomes a node of the vibration of the upper vacuum vessel 1A. Thus the vibration the upper vacuum vessel 1A transmitted through the support 7C is suppressed and the vibration is suppressed from being transmitted to the lower vacuum vessel 1B. Accordingly, the vibration of the upper vacuum vessel 1A due to that of the refrigerator 20 may be preferably prevented from extending to the whole of the superconductive magnet device 1. This prevents a captured image from being disturbed and contributes to the quality enhancement of the image.

Furthermore, the superconductive magnet device 1 comprises the inclined magnetic field coils 8 as a vibration source, and conventionally, the upper vacuum vessel 1A especially tends to be vibrated more easily than the lower vacuum vessel 1B.

On the contrary, according to the embodiment because the refrigerator 20 is disposed above the support 7C and the power lead port 30 is disposed above the support 7D, a vibration response variation may be preferably suppressed, and the quality enhancement of a captured image may be achieved by preventing the image from being disturbed.

In addition, as shown in FIG. 2, although a member E such as a power line (not shown) to the drive motor 21 and a high pressure hose to a compressor not shown is connected to the refrigerator 20, the member E is once brought down toward a sideward floor of the superconductive magnet device 1, and then, is pulled around to outside. According to the embodiment, the member E such as a power line and a high pressure hose is held along an outer peripheral wall of the support 7C.

As described above, the power lead port 30 is disposed above the support 7D. According to the embodiment, the power lead port 30 is attachable and detachable, and a contactor 31 is provided so as to be attachable and detachable at a low temperature portion. Furthermore, a supply port 35 is provided to supply the liquid helium 4. To the supply port 35 is connected a supply pipe 35a connecting to a vicinity of a lowest portion of the lower coil vessel 10B through the support 7D.

Spaces between the contactor 31, each of the superconductive main coils 2, and each of the superconductive shielding coils 3 are electrically connected through a crossover 32 for the purpose of turning on electricity. The crossover 32 is crossed over to the lower vacuum vessel 1B through the inside of the support 7D that is the connection portion of the coil vessels 10A, 10B, and is electrically connected to the superconductive main coil 2 and superconductive shielding coil 3 of the vacuum vessel 1B.

Thus in accordance with the configuration of the crossover 32 being crossed over through the support 7D, because the power lead port 30 is provided above the support 7D, the total length of the crossover 32 may be shortened.

Furthermore, the power lead port 30, similarly to the refrigerator 20 as described above, is also adapted to be heavier than the top plate of the upper vacuum vessel 1A in weight. Therefore, if the power lead port 30 is disposed at a position other than above the support 7D, the weight balance of the upper vacuum vessel 1A is biased, the vibration of the upper vacuum vessel 1A due to the operation of the refrigerator 20 is transmitted through the support 7D also to the lower vacuum vessel 1B, and there is a possibility that the vibration of the upper vacuum vessel 1A extends to the whole of the superconductive magnet device 1.

On the contrary, according to the embodiment, because the power lead port 30 is disposed above the support 7D, as shown in FIG. 4, a portion above the support 7D, that is, a portion where the power lead port 30 is disposed, becomes a node of the vibration of the upper vacuum vessel 1A, and the vibration transmitted through the support 7D is suppressed. Accordingly, the vibration of the upper vacuum vessel 1A is suppressed from being transmitted to the lower vacuum vessel 1B. Accordingly, thanks to the synergy with the suppression of the vibration on the support 7C side described above, the vibration of the upper vacuum vessel 1A may be more preferably prevented from extending to the whole of the superconductive magnet device 1. This prevents a captured image from being disturbed and contributes to the quality enhancement of the image.

In addition, while electricity is passed through the power lead port 30, because gaseous helium is adapted to flow for cooling, a temperature tends to lower at a portion in contact with the port 30 in the upper vacuum vessel 1A, and there is a possibility that dew condensation occurs. A treatment such as heat insulation not shown is normally dispensed so that the dew condensation does not occur; however, even if the dew condensation occurs, because the refrigerator 20 is disposed above the support 7C opposite to the power lead port 30, such defects are not caused that a vacuum packing used for vacuum sealing of the refrigerator 20 deteriorates, and that a moisture generated from the dew condensation permeates the vacuum packing and the vacuum leak of the refrigerator 20 occurs.

Furthermore, the supply pipe 35a connected to the supply port 35 of the power lead port 30 may be pulled around to the lower coil vessel 10B in a shortest distance through the support 7D, and thus the handling of the pipe 35a is made easy.

In addition, as shown in FIG. 2, a power supply line W connected to the power lead port 30 is once brought down toward the sideward floor of the superconductive magnet device 1, and then, is pulled around to outside and the like. According to the embodiment, the power supply line W is held along an outer peripheral wall of the support 7D.

Here will be described effects obtained in the embodiment:

(1) Because it is configured that the refrigerator 20 and the power lead port 30 are separately disposed above the pair of the supports 7C, 7D where the pair of the vacuum vessels 1A, 1B are connected in a state of being faced to each other in the up and down direction, the power lead port 30 is not obstructive in a maintenance work relating to the refrigerator 20, and the refrigerator 20 is not obstructive in an attachment and detachment work of the power lead port 30. Accordingly, the maintenance work of the refrigerator 20 and the attachment and detachment work of the power lead port 30 may be performed simultaneously without a trouble.

Furthermore, because the port 1a of the refrigerator 20 and the power lead port 30 are separately configured, each of the port 1a and the port 30 may be made smaller, compared to a case where they are integrally configured, and the refrigerator 20 and the power lead port 30 are smart in appearance. Furthermore, because the port 1a and the power lead port 30 may be made smaller, both hole diameters of the port 1a and the power lead port 30 formed on the top plate of the vacuum vessel 1A may be made smaller; thus the formation of the holes is easy and a deformation accompanied with the formation is difficult to occur.

(2) Because the power lead port 30 and the refrigerator 20 are not adjacent, the crack of the vacuum packing of the refrigerator 20 due to the gas cooling of the power lead port 30 and the vacuum leak of the refrigerator 20 do not occur, and the performance of the superconductive magnet device 1 may be stably maintained for a long period.

(3) Because the refrigerator 20 is disposed above the support 7C, the portion where the refrigerator 20 is disposed, that is, the portion above the support 7C, becomes the node of the vibration of the upper vacuum vessel 1A, and the vibration transmitted through the support 7C is suppressed. Accordingly, the vibration of the upper vessel 1A due to that of the refrigerator 20 may be preferably prevented from extending to the whole of the superconductive magnet device 1. This prevents a captured image from being disturbed and contributes to the quality enhancement of the image.

(4) Because the power lead port 30 is disposed above the support 7D, the portion above the support 7D, that is, the portion where the power lead port 30 is disposed, becomes the node of the vibration of the upper vacuum vessel 1A, and the vibration transmitted through the support 7D is suppressed. Accordingly, thanks to the synergy with the suppression of the vibration of the upper vacuum vessel 1A on the support 7C side, the vibration may be more preferably prevented from extending to the whole of the superconductive magnet device 1.

(5) Because the member E such as a power line and a high pressure hose connected to the refrigerator 20 is provided along the outer peripheral wall of the support 7C, wiring of the member E may be performed in a neat and collected state.

Furthermore, because the power supply line W connected to the power lead port 30 is held on the support 7D side along the outer peripheral wall thereof, the wiring of the line W is not biased to the support 7C side; as a result thereof, the appearance of the supports 7C, 7D may be made smart. This has an effect that the gantry gap of the superconductive magnet device 1 looks to be wider, and gives an open feeling to a patient body.

(6) The supply pipe 35a connected to the supply port 35 of the power lead port 30 may be pulled around to the lower coil vessel 10B in the shortest distance through the support 7D, and thus the handling of the pipe 35a is made easy and the total length thereof may be shortened.

(7) Because the power lead port 30 is disposed above the support 7D, the crossover 32 may be crossed over to the lower vacuum vessel 1B through the inside of the support 7D that is the connection portion of the coil vessels 10A, 10B, and the total length of the crossover 32 may be shortened.

(8) Because the refrigerator 20 is disposed above the support 7C and the power lead port 30 is disposed above the support 7D, the vibration response variation may be preferably suppressed in the upper vacuum vessel 1A where a vibration tends to be generated by the inclined magnetic field coils 8; thus a captured image is prevented from being disturbed, and the quality enhancement of the image may be achieved.

(9) In accordance with the MRI apparatus where the superconductive magnet device 1 is used, because the maintenance work of the refrigerator 20 and the attachment and detachment work of the power lead port 30 may be performed simultaneously without a trouble, the time saving of the maintenance work may be achieved, its economical effect is large, and the cost of the maintenance work may be reduced by the time saving.

Figure 5:
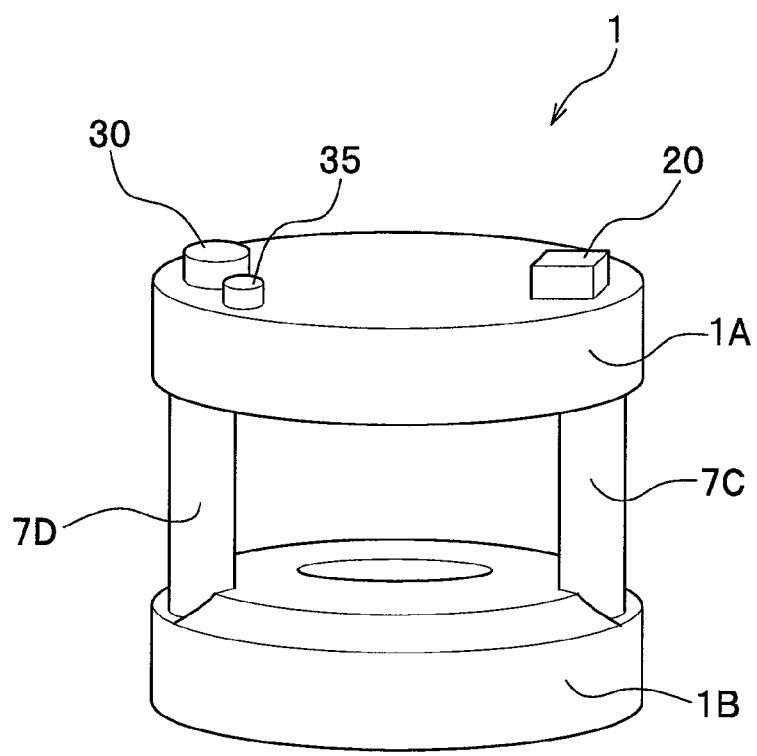
FIG. 5 is a drawing showing a modification example of the superconductive magnet device.

In addition, as shown in FIG. 5, the supply port 35 may be provided separately from the power lead port 30 and be disposed beside the port 30.

Furthermore, as shown in a dashed line in FIG. 3, it may be configured that a rib 1b is provided on the top plate of the upper vacuum vessel 1A, and that thereby the strength of the top plate is heightened. In this case by providing the rib 1b between the port 1a and the power lead port 30 (see FIG. 1), a space between the two nodes may be reinforced, and the vibration of the upper vacuum vessel 1A may be more preferably suppressed from being transmitted through the supports 7C, 7D.

What is claimed is:

1. A superconductive magnet device comprising:
    a pair of coil vessels configured to house a plurality of superconductive coils formed circularly, together with a refrigerant;
    a pair of vacuum vessels, including an upper vacuum vessel and a lower vacuum vessel, configured to house the coil vessels in the vacuum vessels, respectively; and
    a pair of supports configured to connect the vacuum vessels to each other in a state of the vacuum vessels being faced to each other in an up and down direction with the upper vacuum vessel above the lower vacuum vessel, wherein a space between the upper vacuum vessel and the lower vacuum vessel is made into a uniform magnetic field space;
    wherein the upper vacuum vessel is provided with a refrigerator and a power lead port at an upper portion thereof; and
    wherein the refrigerator is disposed above one support of the pair of the supports, and the power lead port is disposed above the other support different from the one support.

2. The superconductive magnet device according to claim 1, wherein a supply port for supplying the refrigerant is provided at the power lead port.

3. The superconductive magnet device according to claim 2,
    wherein each of the coil vessels comprises each one of the superconductive coils and the superconductive shielding coils of which diameters are larger than those of the superconductive coils, and
    wherein the power lead port is disposed between the superconductive coil and the superconductive shielding coil in a radial direction of one coil vessel positioned upper than the other coil vessel out of the coil vessels.

4. An magnetic resonance imaging apparatus having the superconductive magnet device according to claim 3, the apparatus comprising:
    a bed where a patient body is placed;
    a carrier device configured to carry the patient body placed on the bed to an imaging region; and an analyzer configured to analyze a nuclear magnetic resonance signal from the patient body carried to the imaging region by the carrier device.

5. An magnetic resonance imaging apparatus having the superconductive magnet device according to claim 2, the apparatus comprising:

a bed where a patient body is placed;

a carrier device configured to carry the patient body placed on the bed to an imaging region; and an analyzer configured to analyze a nuclear magnetic resonance signal from the patient body carried to the imaging region by the carrier device.

6. The superconductive magnetic device according to claim 1, wherein each of the coil vessels comprises each one of the superconductive coils and a superconductive shielding coils of which diameters are larger than those of the superconductive coils, and wherein the power lead port is disposed between the superconductive coil and the superconductive shielding coil in a radial direction of one coil vessel positioned upper than the other coil vessel out of the coil vessels.

7. An magnetic resonance imaging apparatus having the superconductive magnet device according to claim 6, the apparatus comprising:

a bed where a patient body is placed;

a carrier device configured to carry the patient body placed on the bed to an imaging region; and an analyzer configured to analyze a nuclear magnetic resonance signal from the patient body carried to the imaging region by the carrier device.

8. An magnetic resonance imaging apparatus having the superconductive magnet device according to claim 1, the apparatus comprising:

a bed where a patient body is placed;

a carrier device configured to carry the patient body placed on the bed to an imaging region; and an analyzer configured to analyze a nuclear magnetic resonance signal from the patient body carried to the imaging region by the carrier device.

* * * * *

UNITED STATES PATENT AND TRADEMARK OFFICE
CERTIFICATE OF CORRECTION

PATENT NO. : 7,528,605 B2 Page 1 of 1
APPLICATION NO. : 11/940668
DATED : May 5, 2009
INVENTOR(S) : Chiba et al.

It is certified that error appears in the above-identified patent and that said Letters Patent is hereby corrected as shown below:

On the cover page, item (73) should read:

Hitachi, Ltd., Tokyo (JP), Hitachi Kyowa Engineering Co., Ltd, ~~Hitachi-shi, Tokyo~~ Ibaraki (JP)

Signed and Sealed this

Sixth Day of July, 2010

David J. Kappos
*Director of the United States Patent and Trademark Office*